United States Patent [19]
Moslehi

[11] Patent Number: 5,261,965
[45] Date of Patent: Nov. 16, 1993

[54] SEMICONDUCTOR WAFER CLEANING USING CONDENSED-PHASE PROCESSING

[75] Inventor: Mehrdad M. Moslehi, Dallas, Tex.

[73] Assignee: Texas Instruments Incorporated, Dallas, Tex.

[21] Appl. No.: 937,232

[22] Filed: Aug. 28, 1992

[51] Int. Cl.[5] .................... B08B 3/08; B08B 3/10; B08B 3/12
[52] U.S. Cl. ............................................. 134/1
[58] Field of Search ................................ 134/1

[56] References Cited
U.S. PATENT DOCUMENTS

| | | | |
|---|---|---|---|
| 3,661,660 | 5/1972 | Wessells et al. | 134/1 |
| 3,762,952 | 10/1973 | Gouin et al. | 134/1 |
| 4,474,199 | 10/1984 | Blaudszun | 134/1 |
| 5,013,366 | 5/1991 | Jackson et al. | 134/1 |
| 5,113,802 | 5/1992 | Le Blanc | 134/1 |
| 5,143,663 | 8/1992 | Leyden et al. | 134/1 |

*Primary Examiner*—David Brunsman
*Attorney, Agent, or Firm*—Stanton C. Braden; Richard L. Donaldson; William E. Hiller

[57] ABSTRACT

A method and system for semiconductor wafer cleaning within a condensed-phase processing environment (54) is based on first cooling the semiconductor wafer (52) to a predetermined temperature in order to condense a liquid film (156) on the semiconductor wafer surface from a condensable process gas or gas mixture. Then, the method and system promote thermally activated surface reactions and rapidly evaporate liquid film (156) from the semiconductor wafer surface using a high peak power, short pulse duration energy source such as a pulsed microwave source to dissolve surface contaminants and produce drag forces sufficiently large to remove particulates (154) and other surface contaminants from the surface of the semiconductor wafer. The method and system of this invention can remove various organic, metallic, native oxide, and particulate contaminants from semiconductor wafer surface.

21 Claims, 4 Drawing Sheets

SEMICONDUCTOR WAFER CLEANING USING CONDENSED-PHASE PROCESSING

The U.S. Government has a paid-up license in this invention and the right, in limited circumstances, to require the patent owner to license others on reasonable terms as provided for by the terms of a contract with the United States Air Force under the program name MMST.

TECHNICAL FIELD OF THE INVENTION

The present invention relates to the field of microelectronics and more particularly to semiconductor device fabrication methods and systems and even more particularly to a method and system for semiconductor wafer cleaning within a condensed-phase processing environment.

BACKGROUND OF THE INVENTION

During the processing of semiconductor wafers used in manufacturing integrated circuits and the like, it is often necessary to clean the wafer. One process for cleaning semiconductor wafers is to immerse them in a liquid chemical of a desired composition. The liquid may be stirred or otherwise caused to flow across or against the surfaces of the wafers to provide an effective surface cleaning action. Wet cleaning processes are used to remove various metallic, organic, and particulate contaminants. The wet chemistries are also employed to remove native oxide layers from the wafer surface. The liquid-based cleaning techniques, however, have some limitations. For instance, wet chemistries cannot be easily integrated with other device fabrication processes in a cluster tool environment. Moreover, they may introduce additional contaminants onto the wafers. Additional problems include extensive usage and disposal of chemicals as well as the related environmental considerations. As a result, some vapor-phase processes have been developed which can replace wet chemistries for selected applications such as native oxide removal. However, no viable and proven vapor-phase chemistries exist for effective removal of all the surface contaminants.

One known vapor-phase system that attempts to remove surface particulates use an excimer laser beam to scan the semiconductor wafer. U.S. Pat. No. 4,987,286 to Susan D. Allen and assigned to the University of Iowa Research Foundation, issued Jan. 22, 1991, (hereinafter "Allen" describes a method and apparatus for removing minute particles (as small as sub-micron particles) from a surface to which they adhere. An energy transfer medium is interposed between each particle to be removed and the surface to which the particles adhere. The medium is then irradiated with laser energy at a wavelength which is strongly absorbed by the medium. The medium absorbs sufficient energy to cause explosive evaporation with sufficient force to dislodge the particles. That method and system, however, requires scanning the semiconductor device and has two significant drawbacks.

One limitation of Allen is that by having to scan the semiconductor wafer with the smaller laser beam, throughput of this cleaning method is limited. Excimer lasers are expensive and require significant maintenance costs to operate. This makes the scanning procedure a time consuming and expensive procedure. Another limitation is that the scanning itself may cause local thermal stresses that adversely affect the physical characteristics and performance of the semiconductor device. Also, another limitation is that the method of the Allen is only applicable to particulate removal.

Consequently, there is a need for an improved method for removing particulates and other contaminants from semiconductor wafers that avoids the use of expensive laser devices, and that provides more effective removal of both particulates and other contaminants.

There is a need for a method and system that permit particulate removal and substrate cleaning with a condensed-phase processing environment.

There is a need for a method and system that provide both pre-process and post-process particulate removal and surface cleaning in a semiconductor wafer fabrication reactor that uses condensed-phase processing.

There is a further need for a method and system can be easily integrated with cluster tool platforms in order to reduce manufacturing cycle time and enhance fabrication yield.

SUMMARY OF THE INVENTION

The present invention, therefore, provides a method and apparatus for semiconductor wafer cleaning within a condensed-phase processing environment that overcomes limitations of known liquid and vapor-phase methods and apparatus for removing metallic and organic contaminants as well as minute particles from the semiconductor wafer surface.

The processing environment proposed here for semiconductor wafer cleaning is the condensed-phase processing technique. The proposed method of this invention is based on cooled substrate processing in conjunction with suitable process gases and a pulsed process energy source. This technique is applicable to removal of all the surface contaminants including the metallic, organic, native dielectrics, and particulate contaminants.

One aspect of the invention is a method for semiconductor device substrate cleaning within a condensed-phase processing environment that includes the steps of cooling the semiconductor device to a predetermined temperature in a processing environment that has a condensable process gas. With pressure and temperature values in the condensation domain necessary for phase transformation, a film is condensed on the semiconductor wafer surface using the present method and system from the condensable process gas ambient. Then, a high peak power, short-pulse duration power source is used to thermally-activate and rapidly evaporate the film from the semiconductor device and thereby produce thermally-activated surface cleaning reactions and also a drag force sufficient to remove contaminants such as metallic/organic/oxide contaminants from the semiconductor substrate surface and to clean particulates from the surface.

A technical advantage of the present invention is that within a condensed-phase processing environment the method and system induce thermally activated reactions that remove various contaminants using the condensed film via chemical reaction and physical evaporation. Without any necessary change in a condensed-phase processing environment, the present invention dissociates particulates and impurities from the host condensed film as well as from the associated semiconductor substrate beneath the film. The process can occur within an inert or a reactive process gas environment and may take place either prior to semiconductor device fabrication processes (pre-clean steps) or following such processes (post-clean steps).

Another technical advantage of the present invention is that it may be used either in a stand-alone single-wafer automatic vacuum processing reactor or in conjunction with a vacuum-integrated cluster tool.

A technical advantage of the technical invention is that it removes not only particulates, but also other contaminants within a semiconductor wafer by dissolving the surface contaminants of the semiconductor substrate and then rapidly evaporating the film to remove the layers (both chemical cleaning and physical evaporation actions).

Another technical advantage of the present invention is that it performs its cleaning of both particulates and other contaminants using a series of high-power microwave pulses which irradiate the entire semiconductor wafer surface. As a result, the scanning and use of an expensive pulsed excimer laser as in the known method and apparatus for removing particulates is avoided. This significantly improves process through-put in semiconductor manufacturing environments.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The preferred embodiment of the present invention is best understood by referring to the FIGUREs wherein like numerals are used for like and corresponding parts of various drawings.

The method and system of the preferred embodiment are based on face-down wafer processing in a single-wafer processing reactor. The method and system may, however, employ face-up or vertical wafer processing, with or without plasma activation. The reactor contains a low-thermal mass wafer chuck that may be cooled to low temperatures (e.g., down to $-100°$ or $-150°$ C.) and, if necessary, may be heated to a few hundred degrees centigrade. Moreover, the reactor may employ an electron cyclotron resonance (ECR), magnetron, or inductively coupled plasma process energy source. The wall temperature of the reactor chamber may be controlled as desired. One application of the system of the preferred embodiment is global planarization. The global planarization process sequence consists of multiple steps of timed process gas injection and plasma exposure of the compound on the wafer surface. The plasma source may also be a remote plasma source.

Figure 1:
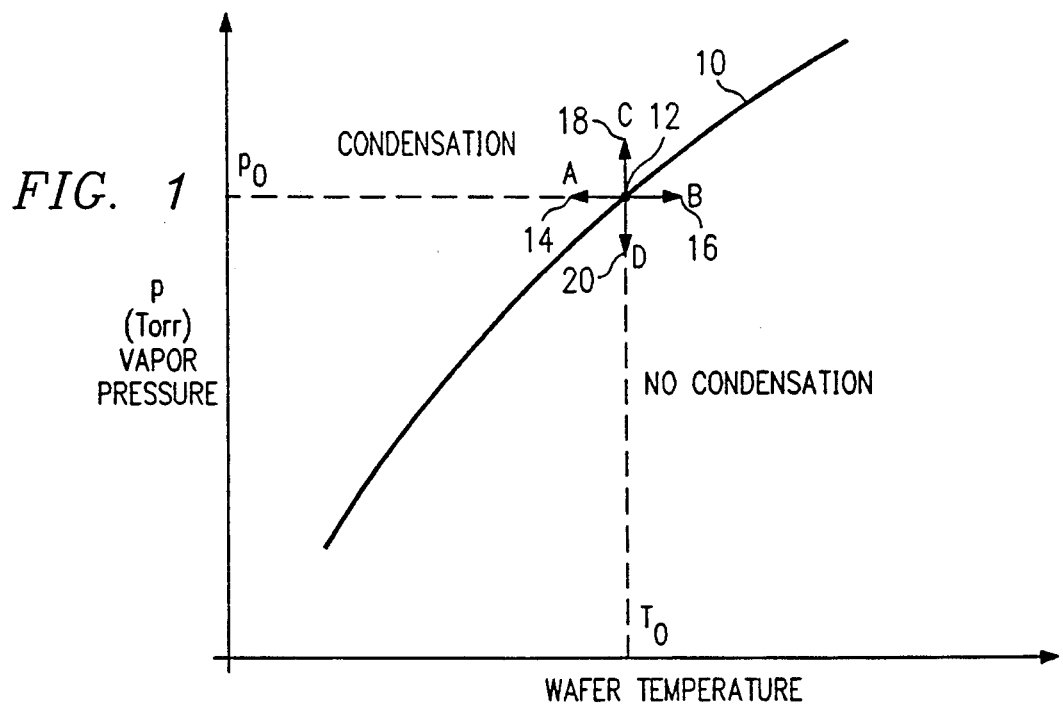
FIG. 1 provides a graph of the representative condensation characteristics of the process gas environment of the preferred embodiment as a function of vapor pressure and temperature.

FIG. 1 provides a qualitative plot of vapor pressure versus temperature to illustrate the condensation region that the preferred embodiment employs. Curve 10 illustrates an exemplary boundary curve separating the condensation region from the vapor-phase region for a given process gas. For example, the process gas may be the combination of TEOS and oxygen or silane and oxygen for deposition of oxide. For a given process environment, a combination of pressure and temperature above curve 10 causes condensation to occur. A combination of pressure and temperature below or to the right of curve 10 will not permit condensation to occur. For arbitrary point 12 on curve 10, the combination of pressure, $p_o$, and temperature, $T_o$, in a fabrication reactor may be taken as the point $(p_o, T_o)$. As the graph of FIG. 1 illustrates, if pressure remains constant at $p_o$, while temperature decreases in the direction of, vector A, condensation occurs within the process environment over the wafer surface. Similarly, for a constant temperature $T_o$, an increase in pressure along vector C, causes condensation to occur. Conversely, for a constant pressure, as temperature increases in the direction of vector B, no condensation occurs. Likewise, for a given temperature, as pressure decreases in the direction of vector D, no condensation occurs. As a result, with a given process environment pressure, if wafer temperature ranges between points 14 and 16 along constant pressure vectors A and B, or pressure ranges between points 18 and 20 along vectors C and D, respectively, a controllable process environment for process gas condensation can exist.

Figure 2:
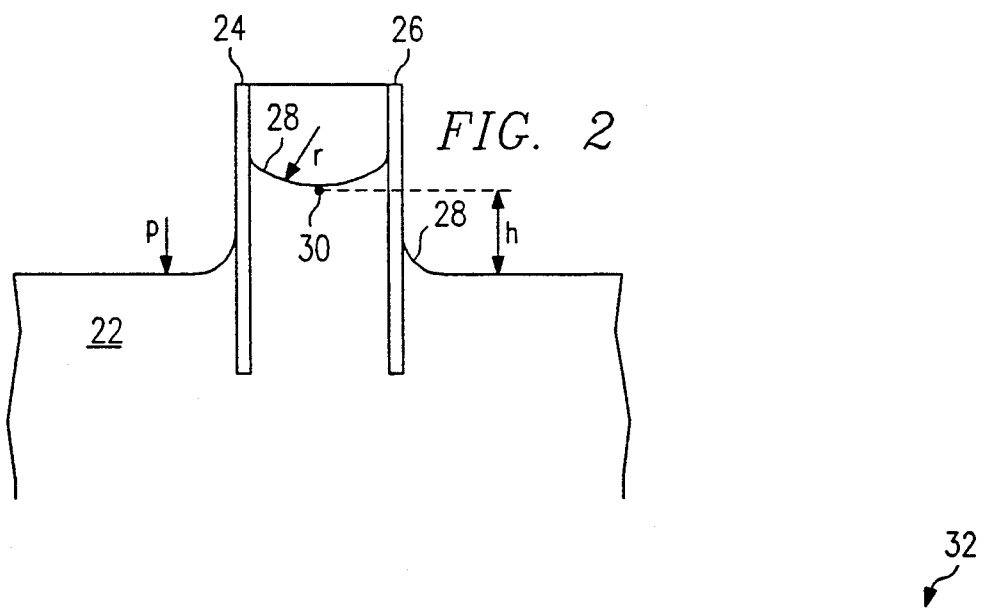
FIG. 2 illustrates the surface tension phenomenon that the present invention employs in conjunction with a liquid medium.

FIG. 2 illustrates the surface tension effects on the liquid surface profile of a tube structure immersed in a liquid medium to illustrate the capillary action that occurs between a liquid and a rigid structure. For example, consider that structure 22 represents a liquid medium and that vertical rigid walls 24 and 26 are the side walls of a capillary-type structure. It is known that for any structure, the tendency of a liquid to require minimum surface area affects the shape of the liquid appearing on the surface. Surface effects can be expressed in terms of chemical potentials. Furthermore, a known phenomena of liquid is that the pressure inside a curved surface is always greater than the pressure outside. However, as the radius of the curvature, r, approaches infinity, the pressure difference between the internal and external pressure drops to zero. These phenomena cause the capillary action or phenomena that FIG. 2 illustrates.

As a result of the capillary action, when a liquid is placed over structure 24 and 26, a quantity of liquid will form having a height, h, above the level on the main liquid surface. Thus, when the liquid and the capillary material or structure attract each other more strongly than the liquid molecules attract each other, the liquid in the tube climbs the walls. As a result, the capillary curved point 30 results. Moreover, when the liquid and the capillary material attract each other less strongly than the liquid molecules attract each other (e.g., mercury and glass), the liquid in the tube retracts from the walls, resulting in capillary depression. These phenomena have useful effects for purposes of the present invention.

Figure 3:
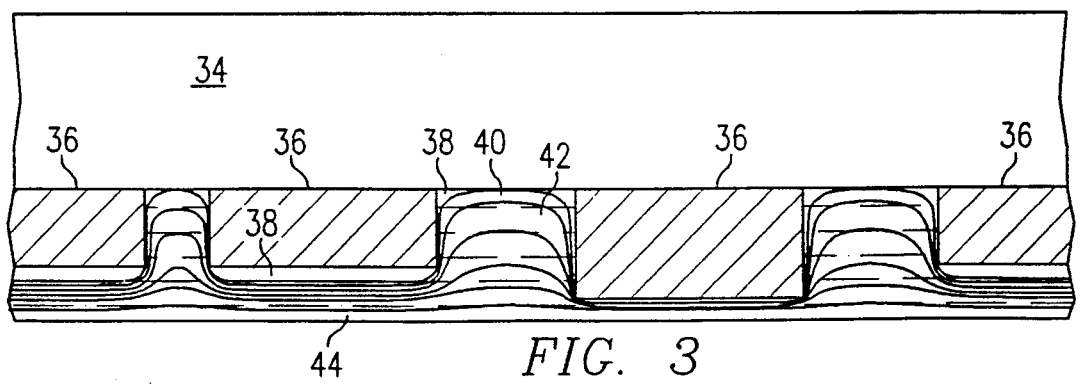
FIG. 3 illustrates the progressive condensation and planarized deposited layers that may occur on a semiconductor device using the preferred embodiment.

The phenomena that FIGS. I and 2 illustrate coordinate to promote the phenomena that FIG. 3 illustrates in causing planarized surface of the preferred embodiment for the global planarization application. With reference to FIG. 3, semiconductor device 32 is shown face-down and includes, for example, substrate material 34 to which attach topological structures such as the structures designated uniformly as 36. The face-down structure of semiconductor device 32 is shown with multiple layers of material that have been deposited. The first is a liquid subsequently solidified over substrate 34 and topological structures 36. These layers are designated, for example, successively as layer 38, layer 40, layer 42, and on out to planarized layer 44. The successive layers illustrate how the preferred embodiment adds to successively cause globally planarized material layer 44. For example, layer 38 may at first cover the topological devices 36 and begin to fill the area within the space that separates adjacent topological structures 36. As successive layers of liquid are condensed and then solidified, less material covers structures 36 and more material fills the voids or valleys between these structures. Eventually, globally planar surface such as surface 44 of deposited material results. The following detailed description illustrates how the preferred embodiment achieves the globally planarized structure of material layer 44.

Figure 4:
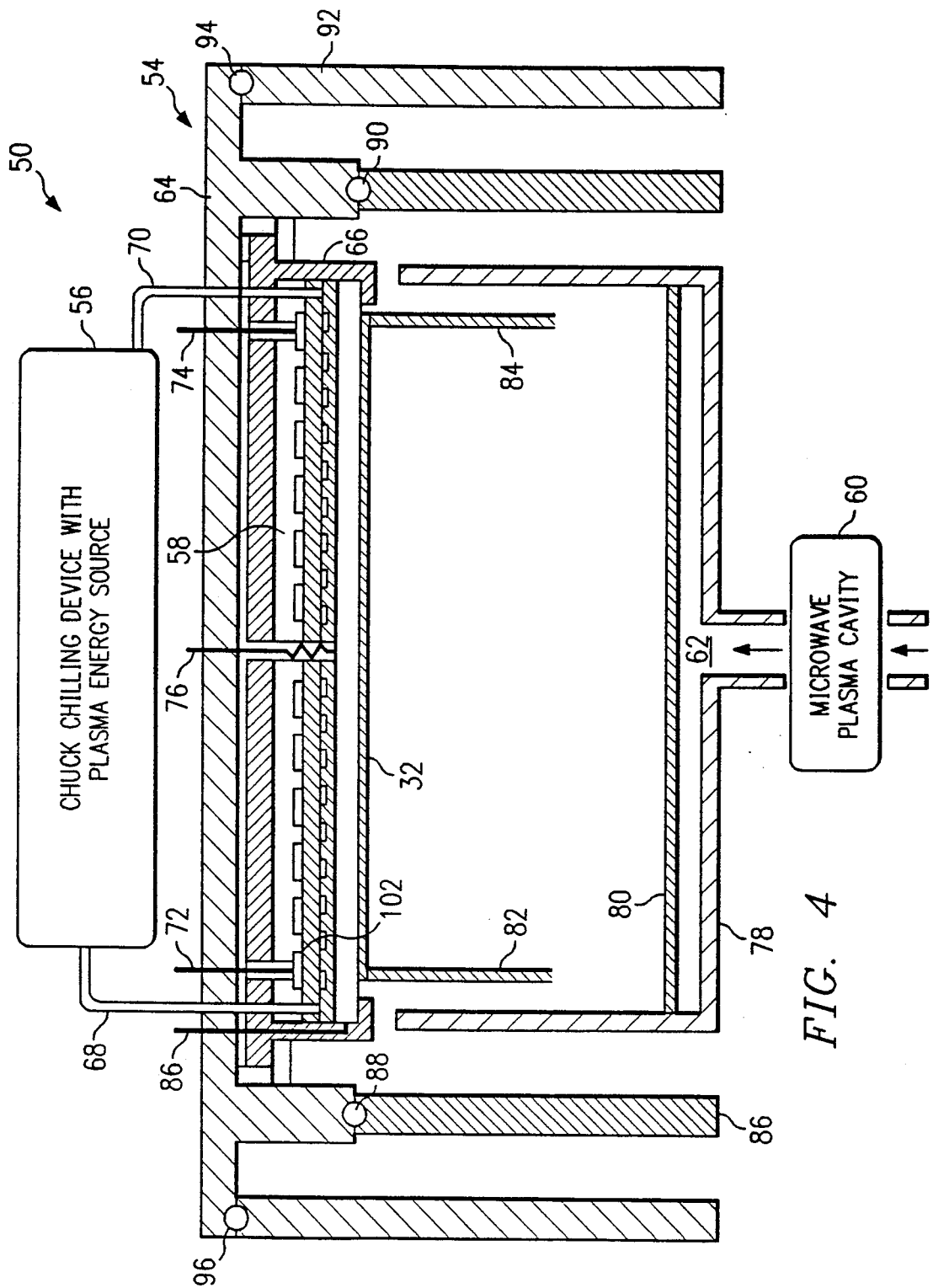
FIG. 4 shows a simplified fabrication reactor process chamber that highlights the important elements of the preferred embodiment.

Referring to FIG. 4, there is shown an exemplary process environment 50 for semiconductor wafer 32 that may include numerous semiconductor devices such as semiconductor device 32 of FIG. 3. The environment includes process chamber 54 that contains semiconductor wafer 32, a chilling device 56 for chilling radio-frequency (RF) chuck 58 and a microwave plasma cavity 60 (optional) for injecting remote plasma into process chamber 54 along showerhead path 62. Process chamber 54 also includes metallic plate 64 that contains chuck holding device 66 for holding radio-frequency chuck 58. In this example, chuck chilling device may chill a fluid (liquid or compressed gas) that conducts through chuck inlet 68 to chuck outlet 70. Chuck 58, therefore, will cause semiconductor wafer 32 to reach a sufficiently low temperature to cause a process gas to condense over the semiconductor wafer 32 surface. Although two plasma energy sources (RF and microwave plasmas) are shown in FIG. 4, only one energy source may be employed (RF plasma or microwave plasma). Moreover, it is possible to use pulsed microwave energy source for selective surface heating without the use of any plasma energy source.

In the example of FIG. 4, chuck 58 contains a plurality of passages that permit the flow of a cooling fluid from a chiller. Additionally, chuck 58 may include conducting leads 72 and 74 that send a radio-frequency signal to radio-frequency chuck 58. Furthermore, to determine the temperature of radio-frequency chuck 58, thermocouple connection 76 permits direct contact to a portion of chuck 58 that contacts semiconductor wafer 32 to determine the temperature of semiconductor wafer 32.

Surrounding the process environment 50 for semiconductor wafer 32 is gas showerhead assembly 78 that includes showerhead 80 which guides process gases toward to semiconductor wafer 32. The showerhead assembly may be heated to prevent gas condensation on its surface. Pins 82 and 84 cause semiconductor wafer 32 to clamp against radio-frequency chuck 58. To maintain the process environment, chamber walls 86 seals at junctures, such as junctures 88 and 90. Furthermore, process environment 54 is surrounded by the outer fabrication reactor wall 92 which joins metallic base 64 at junctures such as junctures 94 and 96.

The process environment that FIG. 4 illustrates is sufficient for globally planarized material layer deposition using condensed-phased processing. The planarization process may employ a sequence of process gas condensation and plasma exposure steps followed with a final thermal annealing step. For example, the process may employ an ambient consisting of TEOS, oxygen, and argon environment. In a TEOS-containing environment, the total process pressure may be, for example, between 0.1 and 10 mTorr for ECR plasma, 10 to 100 mTorr for magnetron plasma processing, or 100 mTorr to 10 Torr for a parallel-plate plasma deposition system. Possible process activation energy sources may include one or more of the following combinations including a plasma energy source, a high power microwave energy source, and/or perhaps a pulsed microwave or light source. For the purposes of the present invention, the energy may be pulsed or continuous to cause the reactive surface solidification of the condensed process gas layer.

Figure 5:
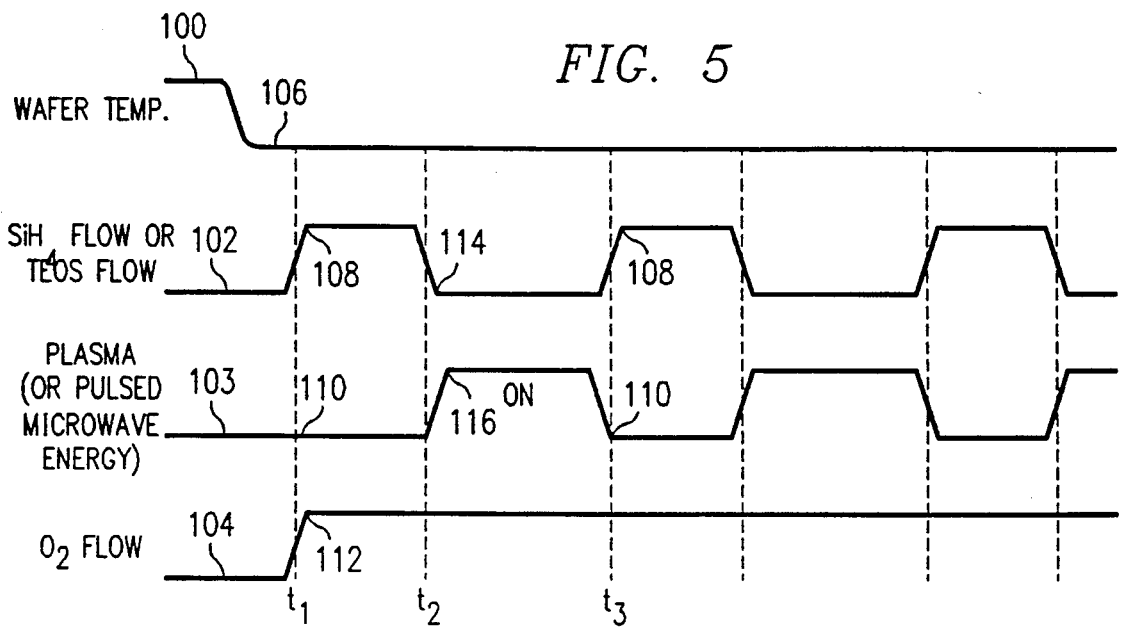
FIG. 5 shows a timing diagram for an example that uses the preferred embodiment for planarized oxide deposition.

FIG. 5 provides a simplified timing diagram showing an application of the global planarization process of the preferred embodiment. The global planarization process sequence consists of multiple steps of timed process gas injection and plasma exposure of the condensed compound on the wafer 32 surface. The plasma source may be ECR, magnetron, or a remote microwave plasma source. The in-situ planarized dielectric deposition process may employ TEOS and oxygen or silane and oxygen or other alternative process chemistries. The temperature of chuck 58 is kept just below the condensation point of the main process gas source (e.g., TEOS), but may be kept above the condensation point for the plasma gas or carrier gas such as oxygen.

Referring to FIG. 5, there appears curve 100 showing a change in wafer temperature, curve 102 showing silane flow or TEOS flow for condensation, curve 103 showing plasma or pulsed microwave energy, and curve 104 illustrating the flow of oxygen gas within process environment 54. At or before time $t_1$, wafer temperature is chilled to level 106, silane or TEOS flow rises to level 108, plasma or microwave energy remains at low level 110, and oxygen flow rises to level 112. During a time period after this time, a first layer of condensing liquid is formed on semiconductor wafer 32. Then, at time $t_2$, wafer temperature remains at the low level of point 106. At time $t_2$, however, condensing gas (TEOS or silane) flow falls to level 114, and plasma or pulsed microwave energy turns on to reach the level at 116. This level causes the condensed liquid layer to solidify via surface reaction forming a deposited solid layer on semiconductor wafer 32. Throughout this period and the remainder of the process, the oxygen gas flow will remain at high level 112. At time $t_3$, a second vapor condensation step will occur at which time the plasma or pulsed energy source will turn off to level 110 as silane or TEOS flow again rises to level 10. This sequence will continue until the desired level of planarization occurs on semiconductor wafer 32.

Figure 6:
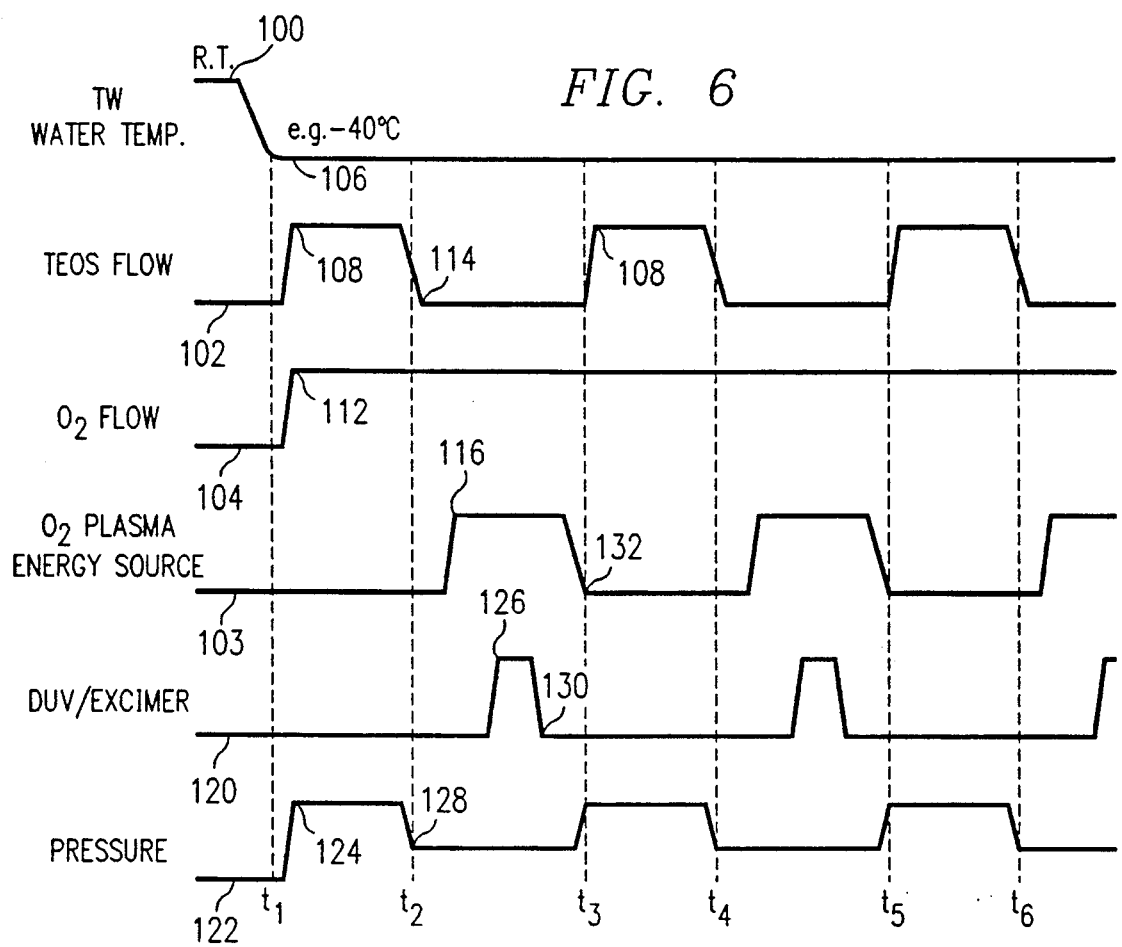
FIG. 6 provides an alternative timing diagram to illustrate a further enhancement of the preferred embodiment.

FIG. 6 illustrate an embellishment of the basic procedure of FIG. 5 for further enhancement of the process results. Referring to FIG. 6, curve 100 represents a time line for semiconductor wafer 32 temperature, line 102 represents TEOS or silane condensing gas flow, curve 104 represents carrier gas flow such as oxygen flow, and curve 103 illustrates plasma energy source operation.

Curve 120 shows the use of a deep ultra-violet or excimer laser to enhance the formation of a solid material layer on semiconductor wafer 32. Curve 122 tracks the pressure established within the process environment 54 (assuming a constant pumping speed). According to FIG. 6, wafer temperature is lowered at or before time $t_1$ to initial low level indicated at point 106. At or about the same time the condensing process gas TEOS or silane flow rises to level 108 and the carrier gas flow rises to level 112. Energy source levels remain low at time t1 and the deep ultraviolet or excimer laser (or pulsed microwave energy source) remains off as curve 120 shows. At time $t_1$ and due to the introduction of process and carrier gases, pressure rises to level 124. At time t2, with wafer temperature remaining at low level 106, TEOS or silane flow returns to low level 114, while oxygen gas flow remains at a high level. At or about time t2, the plasma energy source turns on to level 116. Then, the laser (or pulsed microwave) energy source turns on to create a scanning (or broad area) heat pulse on semiconductor wafer 32 surface. Curve 120 rising to level 126 illustrates this step.

Because process or condensing gas (TEOS or silane) goes to level 1114 at curve 102, pressure within process environment 54 will fall to medium level 128. Medium pressure level 128 primarily reflects the continuing flow of the oxygen plasma gas. After a short period, the laser (or pulsed microwave source) turns off as indicated by curve 120 falling to the previous off level 130. Then, the $O_2$ plasma energy source will turn off a short time later as indicated by curve 103 falling to level 132. Condensing gas (TEOS or silane) will then return to its high flow level 108. This cycle may continue until the desired level of global planarization on semiconductor wafer 32 results.

For a given substrate temperature, the amount of source gas condensation on semiconductor wafer 32 surface in terms of the liquid thickness and/or the number of molecules per unit area is controlled by the condensation time and pressure of the process environment. The condensed TEOS or silane gas, as the timing diagram of FIG. 6 shows, is exposed to a plasma pulse such as an oxygen plasma-producing pulse. In addition, the excimer laser (or pulsed microwave source) may be used as heating source that creates a scanning (or broad area) heat pulse on the wafer surface through, for example, a quartz window.

The deep ultraviolet or excimer laser the operation of which curve 120 indicates accommodates selective surface heating to further drive the reactive solidification and deposition reaction. Thus, one process activation source, such as the $O_2$ plasma energy source of curve 103, provides a surface reaction activation source. Then, deep ultraviolet or excimer laser (or pulsed microwave source) as described by curve 120 selectively heats only the surface condensed film for a very short period of time (e.g., in the range of nanoseconds or microseconds). This does not heat the bulk of the substrate, but only the surface for a very short period of time and provides an alternative method for the deposition of a globally planar material layer.

With this process as a baseline, a further enhancement of the preferred embodiment permits substrate cleaning and particle removal in a condensed-phase processing environment to remove various forms of contaminants from semiconductor wafers. The preferred embodiment induces thermally-activated reactions with condensed-film that promote metallic, organic, native oxide, and/or particulate contaminant removal by surface reactions and condensed film rapid evaporation. Using thermally activated selective surface reactions and rapid evaporation, the preferred embodiment causes removal of particulates in a host condensed film. Additionally, the preferred embodiment removes other surface contaminants from the semiconductor substrate via surface chemical reactions. Then, upon thermally evaporating the condensed layer, the dissolved contaminants are removed as the condensed layer transforms to a gas. By virtue of the rapid evaporation, a physical drag effect also occurs that causes surface particulates on semiconductor wafer to be removed as the host condensed film is removed via thermal evaporation. This process may employ an inert gas or a reactive gas environment and may be useful for pre-process, as well as post-process particulate removal with either a stand-alone single-wafer reactor or a vacuum-integrated cluster tool as fabrication reactor. The following discussion illustrates the basic concepts of the preferred embodiment of the present invention as applied for surface contaminant removal.

Figure 7:
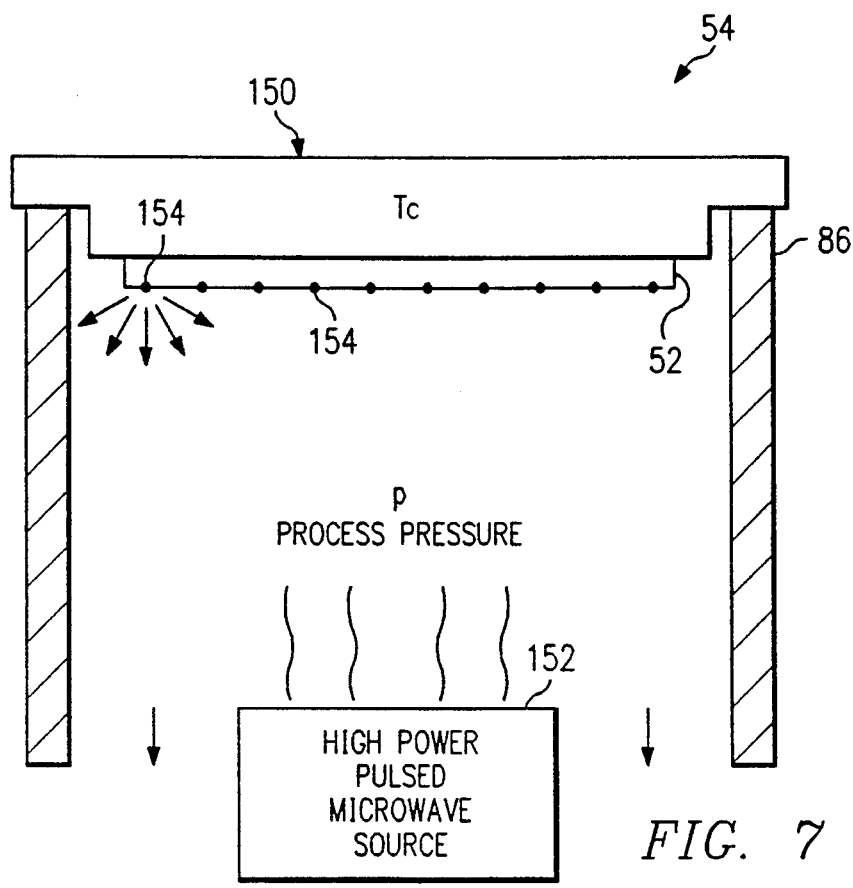
FIG. 7 shows yet another embodiment of the present invention using a pulsed, high-power process energy source.

Referring to FIG. 7, there is shown a simplified schematic diagram of the process environment 54 that includes the cooling device and chuck configuration which shall here be simply called a cooled chuck and generally designated as 150. Attached to cooled chuck 150, which is shown in an exaggerated side view in FIG. 7. This environment is bounded by process chamber wall 86 and does not show the showerhead assembly of FIG. 4. The process environment 54 of FIG. 7 further shows a high-power pulsed microwave energy source 152 that provides a pulsed energy output to semiconductor wafer 52. As a result of the high-power pulsed microwave source 152, particulate designated generally as 154 leave the surface of wafer 52 upon the selective thermally activated surface reactions and rapid evaporation, of condensed film 156. This occurs due to a suction or drag effect that the thermally induced evaporation of the condensed layer causes. Using reactive condensed layer, the surface particulates may be initially dissolved in the condensed layer during the rapid surface heating period prior to the start of condensed layer evaporation.

An important aspect of the preferred embodiment is the ability to employ reactive gases that condense to react with various types of surface contaminants. By reacting with the surface contaminants the method and apparatus of this invention are able to clean the wafer surface via the rapid evaporation of the condensate. In particular, the reactive gases may contain hydrochloric acid, chlorine, sulfuric acid, hydrogen peroxide, ammonium hydroxide or other chemical reactants. Suitable reactants can be selected which work well to remove impurities such as iron, zinc, copper or other metallic contaminants by dissolving them into the host condensed film and subsequent evaporation of the liquid layer. This thermally driven surface reactor and subsequent condensed layer evaporation is accomplished by a high-power pulsed microwave energy source.

For the preferred embodiment of the invention, high-power pulsed microwave source 152 may be a klystron or magnetron microwave source that generates pulses of microwave power at a frequency of 2.45 GHz, for example, in the 10-100 kilowatt or even megawatt peak pulse power range, for brief periods of time. Typical microwave pulse width may be in the range of nanoseconds or microseconds (e.g., 100 nanoseconds). Microwave power source 152 sends a series of microwave pulses to semiconductor wafer 52 during the surface reaction and evaporation cycles. The power output of high power pulsed microwave source 152 should not be too small, otherwise, rapid evaporation sufficient to remove particulates will not occur. Conversely, power output must be sufficiently small to avoid damage to semiconductor device structure on wafer 52. This means, however, that the important parameters for high power pulsed microwave source 52 include the pulse width or duration and pulse peak power. The preferred embodiment also strings the pulses of high-power microwave energy at a given frequency such as frequencies of tens or hundreds of hertz (e.g., 50 Hz). As a result, the preferred embodiment uses a train of high-power microwave pulses at a low frequency to provide the small pulse width with large peak power to semiconductor wafer 52 for selective rapid wafer surface heating.

Figure 8:
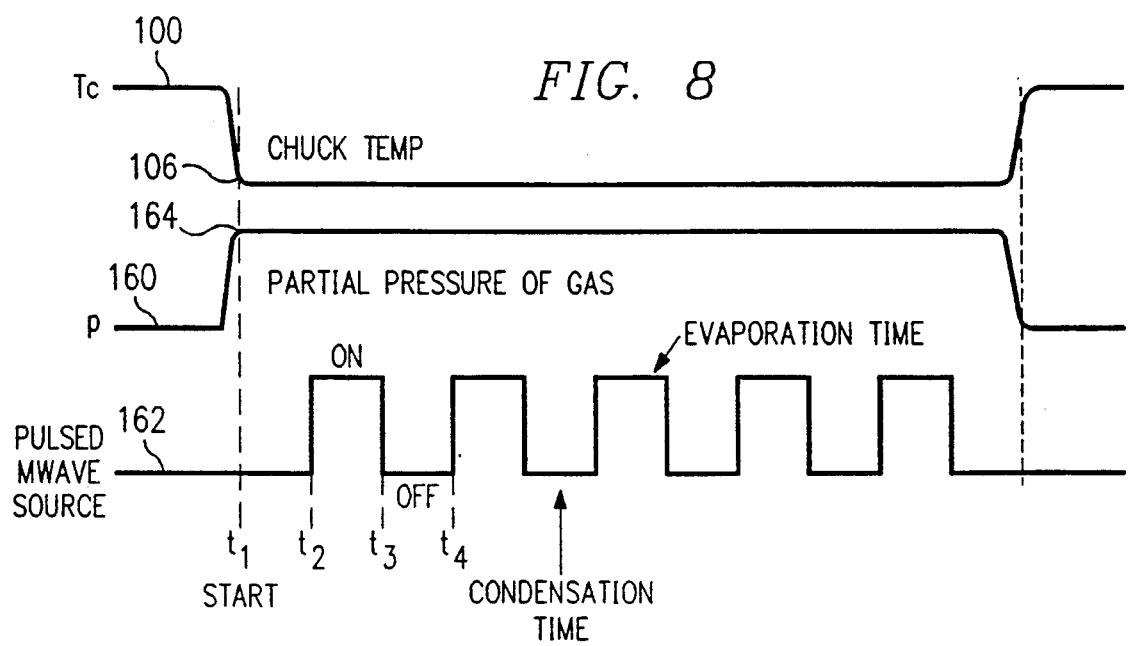
FIG. 8 shows the use of the preferred embodiment for in-situ semiconductor wafer cleaning and particle removal processes.

FIG. 8 shows an exemplary process time line for the particulate removal (or other contaminant removal) aspect of the preferred embodiment. Referring to FIG. 8, curve 100 illustrates the temperature of chuck 150, curve 160 illustrates the partial pressure of gas within condensed-phase processing environment, and curve 162 illustrates the operation of high-power pulsed microwave energy source 152. At time $t_1$, chuck 150 cools from a high level to cooled level 106 to promote condensed-phase processing and controlled formation of a liquid film on semiconductor wafer 52. At the same time $t_1$, process gas such as an inert or a reactive vapor enters the process environment 54 so that the partial pressure of gas curve goes to level 164 due to the presence of the process gases in the process environment. Then, for the purpose of causing reactive surface chemical reactions and rapid evaporation, high-power pulsed microwave source 152 begins an activation cycle at time $t_2$ and terminates operation at a later time $t_3$. During the period from $t_2$ to $t_3$, surface cleaning reactions and rapid evaporation of condensed material later on semiconductor wafer 52 occur. Additionally, during the time span between $t_2$ and $t_3$, high-power microwave source may provide hundreds or thousands of short-pulse-width, high-peak-power pulses to semiconductor wafer 52. During the period between $t_1$ and $t_2$ (condensation period) and also between $t_3$ and $t_4$ (surface reaction and evaporation period) after operation of high-power pulsed microwave source 152, sequential liquid film growth (condensation) and surface cleaning reactions occur on semiconductor wafer 52. The cycles of condensation periods followed by surface cleaning periods remove various contaminants from the surface of semiconductor wafer 52.

The preferred embodiment of the substrate cleaning aspect of the present invention selectively and rapidly heats the surface region of semiconductor wafer 52 (without heating the substrate bulk region) so that a condensed layer rapidly cleans the surface and evaporates, resulting in the removal of the surface particulates and substrate impurities. Particle and impurity size may vary from molecular level concentrations to hundreds of angstroms or even several microns in size. Typically, using the preferred power levels from microwave source 152, the temperature at the surface of the condensed liquid film layer on semiconductor wafer 52 may easily reach as high as a few hundred degrees centigrade for very short periods of time (nanoseconds to microseconds).

The preferred embodiment of the present invention has advantages similar to those of the planarized material layer deposition aspect of the preferred embodiment. In essence, high-power pulsed microwave source 152 rapidly and selectively heats a condensed reactive liquid film over the entire surface of semiconductor wafer 52. One known particle removal method uses a pulsed laser source to scan the surface of semiconductor wafer 52. This technique, however, requires scanning the wafer surface with the laser in the presence of steam ambient conditions. Scanning, however, may produce local thermal stresses that the preferred embodiment avoids. Moreover, the preferred embodiment provides uniform heating of only the surface portion of the substrate containing the condensed liquid film on semiconductor wafer 52. Another problem associated with the use of a pulsed laser source to remove particles from the surface of semiconductor wafer 52 is a comparatively peer process throughput. There is also possibility of damage to the device structures during the on-periods of the explosive laser-assisted evaporation. The prior art pulsed laser technique has been only used for particle removal and is not capable of removing other surface contaminants, such as metallic, organic and native oxide impurities.

Microwave source 152, on the other hand, overcomes these limitations and is much less expensive and simpler to use than an excimer laser. Materials that may be used to form the condensed film include water, alcohol, and other reactive chemicals such as HCl, HF, and chlorine, for example. In a preferred embodiment, the peak power density over an exemplary 150 millimeter wafer is about 570 watts per square centimeter. The pulse rate, temperature, and the chamber pressure, however, should be set at values that cause sufficient gas condensation and reactive surface heating and evaporation.

The preferred embodiment of the present invention may be used for both pre-process or post-process wafer cleaning and particulate removal in either a stand-alone single-wafer fabrication reactor or a vacuum-integrated cluster tool system that contains multiple process chambers. In a cluster platform, multiple process modules share the same wafer handling and load lock chamber. The process modules for the cluster reactors may support various etch or deposition processes. In any event, the preferred embodiment of both the globally planarized material layer deposition aspect and the substrate cleaning aspect may be utilized in a condensed-phased processing environment. Accordingly, pre-process wafer cleaning and/or particle removal can have a significant impact on the yield of semiconductor devices. A good example is the formation of high-quality gate insulators.

In summary, the preferred embodiment of the present invention provides planarized material layer deposition and complete surface cleaning on semiconductor wafers in a condensed-phase processing environment. For planarized material layer deposition, the preferred embodiment first cools the semiconductor device to a predetermined temperature and then condenses a liquid film on the semiconductor device from a condensable process vapor. Then, the method and system reactively solidify and deposit the film on the semiconductor device using a pulsed microwave process energy source. It is possible to use a pulsed lamp heating source, such as plasma arc or tungsten-halogen lamps for pulsed selective surface heating. The steps of condensing and solidifying a grown liquid material layer on the semiconductor wafer are repeated to form a progressive globally planar material layer on the semiconductor wafer surface.

For in-situ surface particulate removal and substrate surface cleaning, instead of solidifying the film on a semiconductor device, the preferred embodiment selectively heats the condensed liquid film using a high-power pulsed microwave source (or pulsed incoherent light source) that causes thermally activated surface reactions and rapid evaporation of the condensed film. The rapid evaporation causes both particulates and contaminants associated with the semiconductor device surface to be removed from the surface. The surface cleaning reactions with the heated condensed layer and the drag force from rapid evaporation clean the particulates from the semiconductor surface and surface impurities that react chemically with the reactive condensate.

The globally planar layer deposition aspect of the preferred embodiment has significant applications in semiconductors device manufacturing. The substrate cleaning aspect of the preferred embodiment has numerous applications in essentially all areas of the semiconductor wafer fabrication.

Although the present invention has been described reference to the above-specified embodiments, this description is not meant to be construed in a limiting sense. Various modifications of a disclosed embodiment, as well as, alternative embodiments of the invention, will become apparent to person skilled upon reference to the above description. It is, therefore, contemplated that the appended claims will cover such modifications that fall in the true scope of the invention.

What is claimed is:

1. A method for semiconductor wafer surface cleaning using condensed-phase processing that removes contaminants from the semiconductor wafer in a fabrication reactor, comprising the steps of:
   condensing a film of liquid on a surface of the semiconductor wafer, said film associating with the surface contaminants;
   exposing said film to a high-power broad-beam pulsed heating source to cause said film react with the surface contaminants and to rapidly evaporate said film of liquid for removal said contaminants from the semiconductor wafer.

2. The method of claim 1, wherein said high-power broad-beam pulsed heating source is a pulsed microwave source.

3. The method of claim 2, wherein said exposing step further comprises the step of exposing said film to a high-power pulsed microwave source having peak output powers of between approximately 10 kilowatts and 1000 kilowatts.

4. The method of claim 3, wherein said film exposing step further comprises the step of exposing said film to a high-power pulsed microwave source having a frequency of approximately 2.45 GHz.

5. The method of claim 3, wherein said exposing step further comprises the step of exposing said film to a high-power pulsed microwave source that produces a series of pulses wherein each of said pulses has a duration of approximately 100 nanoseconds and each of said series of trains of pulses has a frequency of between approximately 10 Hz and 10 kHz.

6. The method of claim 1, wherein said high-power broad-beam pulsed heating source is a pulsed light source.

7. The method of claim 1, wherein said exposing step further comprising the step of removing particulates from said surface of the semiconductor wafer.

8. The method of claim 1, wherein said exposing step further comprises the step of removing contaminants from a plurality of layers associated with said surface of the semiconductor wafer.

9. The method of claim 8, wherein said contaminant removing step further comprises the step of removing metallic impurities from said layers.

10. The method of claim 8, wherein said contaminant removing step further comprises the step of removing iron impurities removing from said layers.

11. The method of claim 8, wherein said contaminant removing step further comprises the step of removing zinc impurities from said layers.

12. The method of claim 8, wherein said contaminant removing step further comprises the step of removing copper impurities from said layers.

13. The method of claim 8, wherein said contaminant removing step further comprises the step of removing organic impurities from said layers.

14. The method of claim 8, wherein said contaminant removing step further comprises the step of removing native oxide impurities from said layers.

15. The method of claim 1, Wherein said film condensing step further comprises the step of condensing an inert liquid layer on said surface 16. The method of claim 1, wherein said film condensing step further comprises the step of condensing a chemically reactive liquid layer on said surface.

17. The method of claim 16, wherein said reactive liquid condensing step further comprises the step of condensing hydrochloric acid on said surface.

18. The method of claim 16, wherein said reactive liquid condensing step further comprises the step of condensing sulfuric acid on said surface.

19. The method of claim 16, wherein said reactive liquid condensing step further comprises the step of condensing an alcohol on said surface.

20. The method of claim 16, wherein said solvent condensing step further comprises the step of condensing ammonium hydroxide on said surface.

21. The method of claim 16, wherein said solvent condensing step further comprises the step of halogen-containing vapor on said surface.

* * * * *